US010693061B2

(12) United States Patent
El-Hinnawy et al.

(10) Patent No.: US 10,693,061 B2
(45) Date of Patent: *Jun. 23, 2020

(54) SEMICONDUCTOR DEVICES HAVING PHASE-CHANGE MATERIAL (PCM) RADIO FREQUENCY (RF) SWITCHES AND INTEGRATED ACTIVE DEVICES

(71) Applicant: Newport Fab, LLC, Newport Beach, CA (US)

(72) Inventors: Nabil El-Hinnawy, Irvine, CA (US); Gregory P. Slovin, Irvine, CA (US); Jefferson E. Rose, Hawthorne, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/276,094

(22) Filed: Feb. 14, 2019

(65) Prior Publication Data
US 2020/0058852 A1 Feb. 20, 2020

Related U.S. Application Data

(63) Continuation-in-part of application No. 16/274,998, filed on Feb. 13, 2019, and a continuation-in-part of
(Continued)

(51) Int. Cl.
*H01L 45/00* (2006.01)
*H01L 27/24* (2006.01)
(Continued)

(52) U.S. Cl.
CPC .......... *H01L 45/06* (2013.01); *H01L 23/481* (2013.01); *H01L 23/66* (2013.01); *H01L 24/16* (2013.01);
(Continued)

(58) Field of Classification Search
None
See application file for complete search history.

(56) References Cited

U.S. PATENT DOCUMENTS 5,976,932 A 11/1999 Kerber
6,448,576 B1 9/2002 Davis
(Continued)

FOREIGN PATENT DOCUMENTS

WO WO 2016/028362 2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.
(Continued)

*Primary Examiner* — J. E. Schoenholtz
(74) *Attorney, Agent, or Firm* — Farjami & Farjami LLP

(57) ABSTRACT

An IC ("integrated circuit") chip includes a substrate and a phase-change material (PCM) radio frequency (RF) switch, having a heating element, a PCM situated over the heating element, and PCM contacts situated over passive segments of the PCM. The heating element extends transverse to the PCM and underlies an active segment of the PCM. An active device is situated in the substrate. In one approach, the PCM RF switch is situated over the substrate, and the substrate is a heat spreader for the PCM RF switch. In another approach, the PCM RF switch is situated in or above a first metallization level, and a dedicated heat spreader is situated under the PCM RF switch. Alternatively, a PCM RF switch is situated in a flip chip, an active device is situated in the IC chip, and the flip chip is situated over the IC chip forming a composite device.

21 Claims, 9 Drawing Sheets

Related U.S. Application Data application No. 16/161,960, filed on Oct. 16, 2018, and a continuation-in-part of application No. 16/114,106, filed on Aug. 27, 2018, and a continuation-in-part of application No. 16/103,490, filed on Aug. 14, 2018, now Pat. No. 10,476,001, and a continuation-in-part of application No. 16/103,646, filed on Aug. 14, 2018, now Pat. No. 10,475,993, and a continuation-in-part of application No. 16/103,587, filed on Aug. 14, 2018, now Pat. No. 10,461,253.

(51) Int. Cl.
    *H01L 23/48*      (2006.01)
    *H01L 23/66*      (2006.01)
    *H01L 23/00*      (2006.01)

(52) U.S. Cl.
    CPC ............ *H01L 27/24* (2013.01); *H01L 45/126* (2013.01); *H01L 45/1226* (2013.01); *H01L 45/1286* (2013.01); *H01L 45/143* (2013.01); *H01L 45/144* (2013.01); *H01L 2224/16145* (2013.01)

(56) References Cited

U.S. PATENT DOCUMENTS

| | | | |
|---|---|---|---|
| 7,522,029 B1 | 4/2009 | Lantz | |
| 8,314,983 B2 | 11/2012 | Frank | |
| 9,257,647 B2 | 2/2016 | Borodulin | |
| 9,362,492 B2 | 6/2016 | Goktepeli | |
| 9,368,720 B1* | 6/2016 | Moon | H01L 45/1286 |
| 9,444,430 B1 | 9/2016 | Abdo | |
| 9,640,759 B1 | 5/2017 | Curioni | |
| 9,891,112 B1 | 2/2018 | Abel | |
| 9,917,104 B1 | 3/2018 | Roizin | |
| 10,128,243 B2 | 11/2018 | Yoo | |
| 10,164,608 B2* | 12/2018 | Belot | H01L 45/1206 |
| 10,529,922 B1* | 1/2020 | Howard | H01L 45/1286 |
| 2005/0127348 A1 | 6/2005 | Horak | |
| 2006/0246712 A1 | 11/2006 | Kim | |
| 2007/0075347 A1 | 4/2007 | Lai | |
| 2008/0142775 A1 | 6/2008 | Chen | |
| 2010/0084626 A1 | 4/2010 | Delhougne | |
| 2010/0238720 A1 | 9/2010 | Tio Castro | |
| 2011/0291784 A1 | 12/2011 | Nakatsuji | |
| 2013/0187120 A1 | 7/2013 | Redaelli | |
| 2013/0285000 A1 | 10/2013 | Arai | |
| 2014/0191181 A1* | 7/2014 | Moon | H01L 27/2409 257/4 |
| 2014/0264230 A1 | 9/2014 | Borodulin | |
| 2014/0339610 A1 | 11/2014 | Rashed | |
| 2015/0048424 A1 | 2/2015 | Tien | |
| 2015/0090949 A1 | 4/2015 | Chang | |
| 2015/0333131 A1 | 11/2015 | Mojumder | |
| 2016/0035973 A1 | 2/2016 | Raieszadeh | |
| 2016/0056373 A1* | 2/2016 | Goktepeli | H01L 45/1608 257/2 |
| 2016/0071653 A1 | 3/2016 | Lamorey | |
| 2016/0308507 A1 | 10/2016 | Engelen | |
| 2017/0092694 A1 | 3/2017 | BrightSky | |
| 2017/0126205 A1 | 5/2017 | Lin | |
| 2017/0187347 A1 | 6/2017 | Rinaldi | |
| 2017/0243861 A1 | 8/2017 | Wang | |
| 2017/0365427 A1 | 12/2017 | Borodulin | |
| 2018/0005786 A1 | 1/2018 | Navarro | |
| 2018/0194615 A1 | 7/2018 | Nawaz | |
| 2018/0269393 A1 | 9/2018 | Zhang | |
| 2019/0064555 A1 | 2/2019 | Hosseini | |
| 2019/0067572 A1 | 2/2019 | Tsai | |
| 2019/0088721 A1* | 3/2019 | Reig | H01P 1/10 |
| 2019/0172657 A1 | 6/2019 | Zhu | |
| 2019/0267214 A1 | 8/2019 | Liu | |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

\* cited by examiner

US 10,693,061 B2

SEMICONDUCTOR DEVICES HAVING PHASE-CHANGE MATERIAL (PCM) RADIO FREQUENCY (RF) SWITCHES AND INTEGRATED ACTIVE DEVICES

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance,". The present application is further a continuation-in-part of and claims the benefit of and priority to application Ser. No. 16/274,998 filed on Feb. 13, 2019, titled "Semiconductor Devices Having Phase-Change Material (PCM) Radio Frequency (RF) Switches and Integrated Passive Devices,". The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds.

In order to rapidly cool down phase-change materials (PCM), heat must be dissipated from a PCM RF switch by using heat spreading techniques. However, heat spreading techniques may pose device design challenges for integrating active devices. Conventional fabrication techniques for integrating active devices may not be easily compatible with PCM RF switches. Various modifications in structure have significant impact on thermal energy management that decrease the reliability of PCM RF switches. Accordingly, integrating PCM RF switches with active devices in the same semiconductor device can present significant challenges. Specialty manufacturing is often impractical, and large scale manufacturing generally trades practicality for the ability to control device characteristics.

Thus, there is a need in the art for semiconductor devices integrating both PCM RF switches and active devices.

SUMMARY

The present disclosure is directed to semiconductor devices having phase-change material (PCM) radio frequency (RF) switches and integrated active devices, substantially as shown in and/or described in connection with at least one of the figures, and as set forth in the claims.

DETAILED DESCRIPTION

Figure 1:
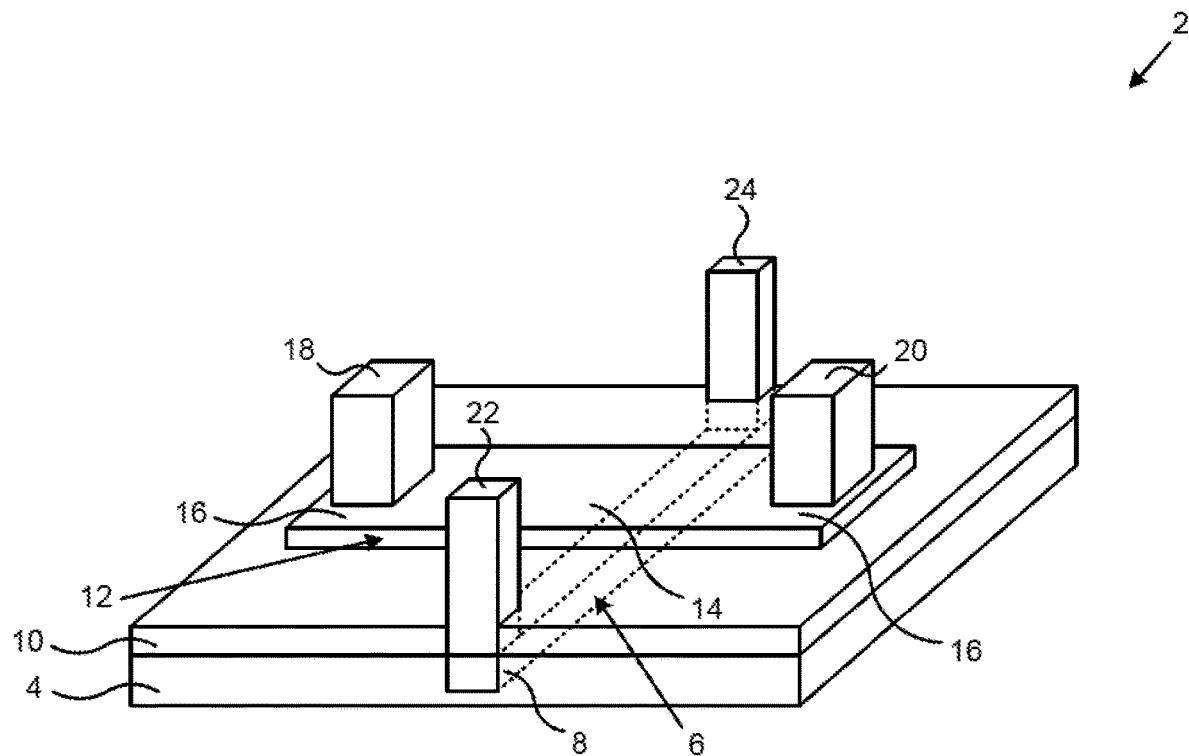
FIG. 1 illustrates a perspective view of a portion of a phase-change material (PCM) radio frequency (RF) switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a perspective view of a portion of a phase-change material (PCM) radio frequency (RF) switch according to one implementation of the present application. As shown in FIG. 1, PCM RF switch 2 includes lower dielectric 4, heating element 6 having terminal segments 8, thermally conductive and electrically insulating material 10, PCM 12 having active segment 14 and passive segments 16, PCM contacts 18 and 20, and heater contacts 22 and 24. For purposes of illustration, the perspective view in FIG. 1 shows selected structures of PCM RF switch 2. PCM RF switch 2 may include other structures not shown in FIG. 1.

Lower dielectric 4 in PCM RF switch 2 is situated below thermally conductive and electrically insulating material 10. As shown in FIG. 1, lower dielectric 4 is also adjacent to sides of heating element 6. Lower dielectric 4 extends along the width of PCM RF switch 2, and is also coplanar with the top of heating element 6. Because PCM RF switch 2 includes lower dielectric 4 on the sides of heating element 6, less heat transfers horizontally (i.e., from the sides) and more heat dissipates vertically, from heating element 6 toward active segment 14 of PCM 12. In various implementations, lower dielectric 4 can have a relative width and/or a relative thickness greater or less than shown in FIG. 1. Lower dielectric 4 can comprise any material with thermal conductivity lower than that of thermally conductive and electrically insulating material 10. In various implementations, lower dielectric 4 can comprise silicon oxide ($Si_XO_Y$), ($Si_XN_Y$), or another dielectric.

Heating element 6 in PCM RF switch 2 is situated in lower dielectric 4. Heating element 6 also underlies active segment 14 of PCM 12. Heating element 6 generates a crystallizing heat pulse or an amorphizing heat pulse for transforming active segment 14 of PCM 12. Heating element 6 can comprise any material capable of Joule heating. Heating element 6 can be connected to electrodes of a pulse generator (not shown in FIG. 1) that generates crystallizing or amorphizing voltage or current pulses. Preferably, heating element 6 comprises a material that exhibits minimal or substantially no electromigration, thermal stress migration, and/or agglomeration. In various implementations, heating element 6 can comprise tungsten (W), molybdenum (Mo), titanium (Ti), titanium tungsten (TiW), titanium nitride (TiN), tantalum (Ta) tantalum nitride (TaN), nickel chromium (NiCr), or nickel chromium silicon (NiCrSi). For example, in one implementation, heating element 6 comprises tungsten lined with titanium and titanium nitride.

Thermally conductive and electrically insulating material 10 in PCM RF switch 2 is situated on top of heating element 6 and lower dielectric 4, and under PCM 12 and, in particular, under active segment 14 of PCM 12. Thermally conductive and electrically insulating material 10 ensures efficient heat transfer from heating element 6 toward active segment 14 of PCM 12, while electrically insulating heating element 6 from PCM contacts 18 and 20, PCM 12, and other neighboring structures.

Thermally conductive and electrically insulating material 10 can comprise any material with high thermal conductivity and high electrical resistivity. In various implementations, thermally conductive and electrically insulating material 10 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 10 can be a nugget that does not extend along the width of PCM RF switch 2. For example, thermally conductive and electrically insulating material 10 can be a nugget approximately aligned with heating element 6.

PCM 12 in PCM RF switch 2 is situated on top of thermally conductive and electrically insulating material 10. PCM 12 includes active segment 14 and passive segments 16. Active segment 14 of PCM 12 approximately overlies heating element 6 and is approximately defined by heating element 6. Passive segments 16 of PCM 12 extend outward and are transverse to heating element 6, and are situated approximately under PCM contacts 18 and 20. As used herein, "active segment" refers to a segment of PCM that transforms between crystalline and amorphous phases, for example, in response to a crystallizing or an amorphizing heat pulse generated by heating element 6, whereas "passive segment" refers to a segment of PCM that does not make such transformation and maintains a crystalline phase (i.e., maintains a conductive state).

With proper heat pulses and heat dissipation, active segment 14 of PCM 12 can transform between crystalline and amorphous phases, allowing PCM RF switch 2 to switch between ON and OFF states respectively. Active segment 14 of PCM 12 must be heated and rapidly quenched in order for PCM RF switch 2 to switch states. If active segment 14 of PCM 12 does not quench rapidly enough, it will not transform and PCM RF switch 2 will fail to switch states. How rapidly active segment 14 of PCM 12 must be quenched depends on the material, volume, and temperature of PCM 12. In one implementation, the quench time window can be approximately one hundred nanoseconds (100 ns) or greater or less.

PCM 12 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 12 can be germanium telluride having from forty percent to sixty percent germanium by composition (i.e., $Ge_XTe_Y$, where $0.4 \leq X \leq 0.6$ and $Y=1-X$). The material for PCM 12 can be chosen based upon ON state resistivity, OFF state electric field breakdown voltage, crystallization temperature, melting temperature, or other considerations. It is noted that in FIG. 1, heating element 6 extends outwards and is transverse to PCM 12. Heating element 6 is illustrated with dashed lines as seen through various structures of PCM RF switch 2. Current flowing in heating element 6 flows substantially under active segment 14 of PCM 12.

PCM contacts 18 and 20 in PCM RF switch 2 are connected to passive segments 16 of PCM 12. Similarly, heater contacts 22 and 24 are connected to terminal segments 8 of heating element 6. PCM contacts 18 and 20 provide RF signals to and from PCM 12. Heater contacts 22 and 24 provide power to heating element 6 for generating a crystallizing heat pulse or an amorphizing heat pulse. PCM contacts 18 and 20 and heater contacts 22 and 24 can extend through various interlayer metal levels (pot shown in FIG. 1). In various implementations, PCM contacts 18 and 20 and heater contacts 22 and 24 can comprise tungsten (NV), copper (Cu), or aluminum (Al).

Figure 2A:
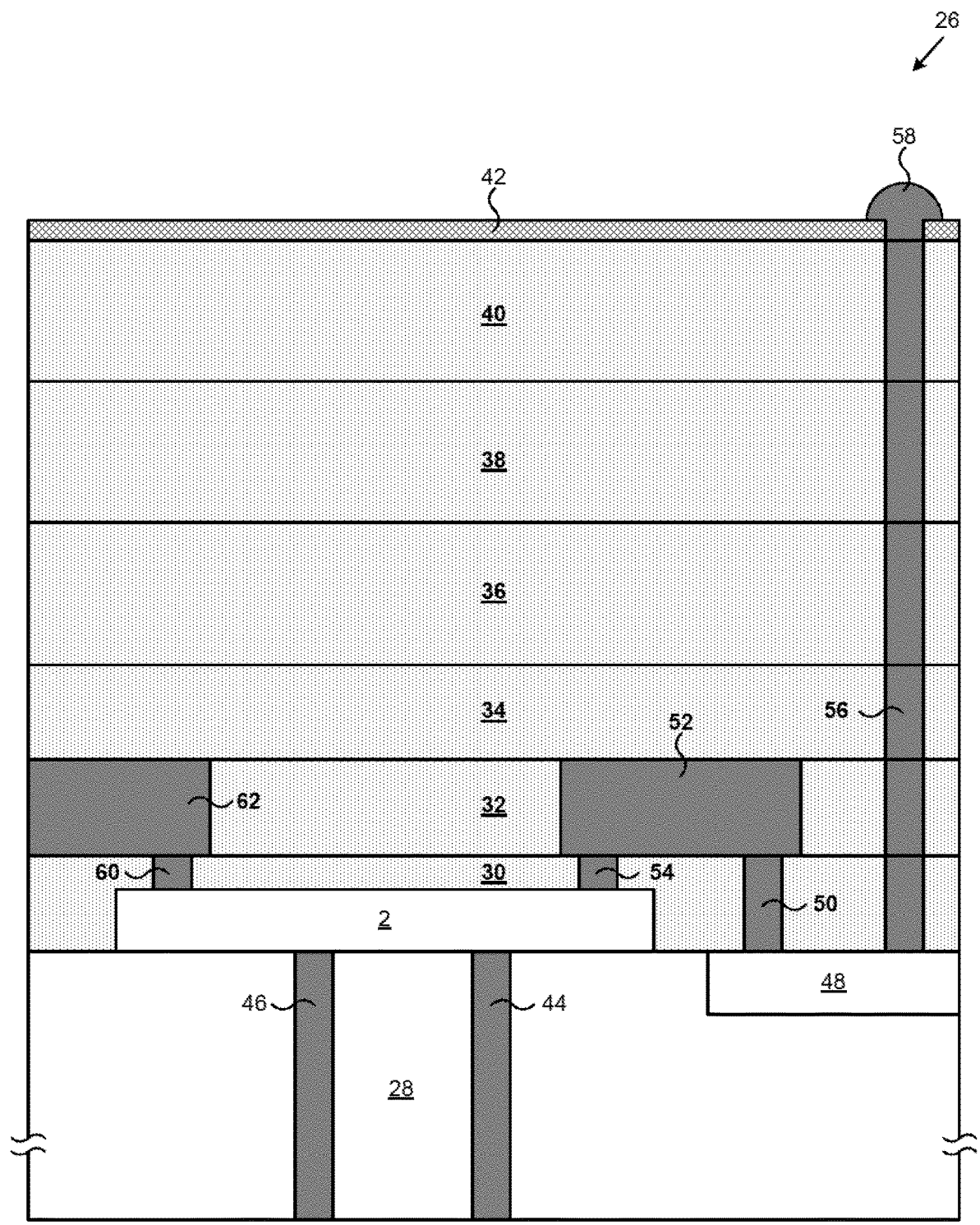
FIG. 2A illustrates a portion of an exemplary IC ("integrated circuit") chip according to one implementation of the present application.

FIG. 2A illustrates a portion of an exemplary IC ("integrated circuit") chip according to one implementation of the present application. IC chip 26 includes PCM RF switch 2, substrate 28, pre-metal dielectric 30, first metallization level 32, first interlayer dielectric 34, second metallization level 36, second interlayer dielectric 38, third metallization level 40, passivation 42, through-substrate vias (TSVs) 44 and 46, active device 48, vias 50, 54, 56, and 60, interconnect metals 52 and 62, and micro bump 58. It is noted that in the present application, multiple vias, metal segments, and contacts connected as a unit are referred to as a "via" for ease of reference. For example, in FIG. 2A, via 56 includes a contact in pre-metal dielectric 30, a first metal segment in first metallization level 32, a first via in first interlayer dielectric 34, a second metal segment in second metallization level 34, a second via in second interlayer dielectric 28, and a third metal segment in third metallization level 40. Metal segments are typically wider than vias and contacts and include overplots; however, for ease of illustration and for focus on the present inventive concepts, the metal segments and vias and contacts are shown as one continuous "via" 56 in IC chip 26, and a similar definition/representation may apply when using the term "via" in other drawings in the present application. Moreover, the term "via" is used as a generalization to apply to contacts, such as contacts 50, 54, and 60, since depending on various implementations, and in general, in addition to contacts, vias and metal segments might also be used to connect to higher metallization levels. A similar definition/representation may apply when using the term "via" in other drawings in the present application.

PCM RF switch 2 in FIG. 2A generally corresponds to PCM RF switch 2 in FIG. 1, and may have any implementations and advantages described above. However, PCM RF switch 2 is shown with less detail in FIG. 2A to preserve conciseness. Pre-metal dielectric 30 is situated over substrate 28. First metallization level 32, first interlayer dielectric 34, second metallization level 36, second interlayer dielectric 38, third metallization level 40, and passivation 42 are sequentially situated over pre-metal dielectric 30. In various implementations, substrate 28 is a silicon (Si), germanium (Ge), silicon germanium ($Si_XGe_Y$), silicon carbide ($Si_XC_Y$), or group III-V substrate. In various implementations, pre-metal dielectric 30 can comprise borophosphosilicate glass (BPSG), tetra-ethyl ortho-silicate (TEOS), silicon onynitride ($Si_XO_YN_Z$), silicon oxide ($Si_XO_Y$), silicon nitride ($Si_XN_Y$), or another dielectric. In various implementations, first interlayer dielectric 34, second interlayer dielectric 38, and passivation 42 can comprise $Si_XO_Y$, $Si_XN_Y$, or another dielectric. For example, in one implementation, first interlayer dielectric 34 and second interlayer dielectric 38 comprise CVD $Si_XO_Y$, and passivation 42 comprises HDP-CVD $Si_XN_Y$. Moreover, first metallization level 32, second metallization level 36, and third metallization level 40 can comprise $Si_XO_Y$, $Si_XN_Y$, or another dielectric between metal segments in each metallization level. For example, in one implementation, first metallization level 32, second metallization level 36, and third metallization level 40 can include high density plasma chemical vapor deposition (HDP-CVD) $Si_XO_Y$ between metal segments in each metallization level. In various implementations, IC chip 26 can include more metallization levels and/or more interlayer dielectrics than those shown in FIG. 2A.

Active device 48 is situated in substrate 28. PCM RF switch 2 is situated in pre-metal dielectric 30 and on substrate 28. TSVs 44 and 46 are situated below PCM RF switch 2 and extend through substrate 28. TSV 44 electrically connects to heater contact 24 (shown in FIG. 1) of PCM RF switch 2. TSV 46 electrically connects to heater contact 22 (shown in FIG. 1) of PCM RF switch 2. Via 50 is situated in pre-metal dielectric 30 between active device 48 and interconnect metal 52. Interconnect metal 52 is situated in first metallization level 32. Via 54 is situated in pre-metal dielectric 30 between PCM RF switch 2 and interconnect metal 52. Via 50, interconnect metal 52, and via 54 electrically connect active device 48 to PCM contact 20 (shown in FIG. 1) of PCM RF switch 2. Via 56 electrically connects active device 48 in substrate 28 to micro bump 58. Micro bump 58 is situated at the top of IC chip 26 and in a window in passivation 42. Via 60 is situated in pre-metal dielectric 30 between PCM RF switch and interconnect metal 62. Interconnect metal 62 is situated in first metallization level 32. Via 60 electrically connects PCM contact 18 (shown in FIG. 1) of PCM RF switch 2 to interconnect metal 62. Interconnect metal 62 can electrically connect to other structures (not shown in FIG. 2A).

Also, it is noted that the actual relative position of TSVs 44 and 46 and vias 54 and 60 may be different from the exemplary cross-sectional view shown in FIG. 2A. For example, TSV 44 in FIG. 2A (connected to heater contact 24 in FIG. 1) may be situated on a different plane relative to vias 54 and 60 (connected to PCM contacts 20 and 18 in FIG. 1 respectively), and TSV 46 in FIG. 2A (connected to heater contact 22 in FIG. 1) may be situated on yet a different plane relative to vias 54 and 60. In other words, TSVs 11 and 46 may be situated in different planes and crosswise to vias 54 and 60.

TSVs 44 and 46 in IC chip 26 increase its versatility. For example, because heater contacts 22 and 24 (shown in FIG. 1) of PCM RF switch 2 are not electrically connected to active device 48 situated in substrate 28, additional vias are not needed. Heater contacts 22 and 24 (shown in FIG. 1) of PCM RF switch 2 are connected to TSVs 46 and 44 disposed below PCM RF switch 2 and extending through substrate 28. As a result, more area is available in first metallization levels 32, second metallization level 36, and third metallization level 40 for other structures, and more area is available at the top of IC chip 26 for external connections. In various implementations, more or fewer TSVs can be connected to PCM RF switch 2.

In IC chip 26, active device 48 is electrically connected to PCM contact 20 (shown in FIG. 1) of PCM RF switch 2. In various implementations, active device 48 can be a transistor, an active circuit, an amplifier, a filter, a mixer, or a diode. For example, active device 48 can be an LNA (low noise amplifier) having its output electrically connected to PCM contact 20 (shown in FIG. 1) of PCM RF switch 2. In various implementations, active device 48 can be an active circuit comprising multiple active devices, or comprising passive devices in combination with at least one active device.

Active device 48 is also electrically connected to micro bump 58. Micro bump 58 provides external connection for IC chip 26. For example, micro bump 58 can provide an LNA (low noise amplifier) input terminal of active device 48. In various implementations, micro bump 58 can comprise tin (Su), copper (Cu), silver (Ag), or gold (Au). For example, micro bump 58 can be an alloy of tin, copper, and silver ($Sn_XCu_YAg_Z$). In various implementations, PCM RF switch 2 and/or active device 48 may have more or fewer connections than shown in FIG. 2A.

In the present example, substrate 28 has high thermal conductivity, and effectively dissipates heat generated by heating element 6 (shown in FIG. 1) of PCM RF switch 2. For example, substrate 28 in FIG. 2A can be monocrystalline silicon (Si), and its thermal conductivity can be approximately one hundred seventy watts per meter-kelvin (170 W/(m·K)). Thus, active segment 14 of PCM 12 (shown in FIG. 1) can rapidly quench and successfully transform phases, and PCM RF switch 2 can switch states with improved reliability.

Substrate 28 in FIG. 2A also has a large mass, which dissipates heat efficiently. Additionally, because substrate 28 is situated on the bottom of IC chip 26, when IC chip 26 is mounted on a printed circuit board (PCB) (not shown in FIG. 2A), substrate 28 can further dissipate heat utilizing the PCB.

The quicker cooling of PCM RF switch 2 allows PCM 12 to utilize different materials and different dimensions that require faster quench times. The quicker cooling of PCM RF switch 2 also allows more area of PCM 12 to be transformed, creating a wider active segment 14. A wider active segment 14 improves RF performance of PCM RF switch 2 by increasing its breakdown voltage and linearity.

Because IC chip 26 employs a multi-level metallization having pre-metal dielectric 30 and sequential metallization levels and interlayer dielectrics, such as first metallization level 32 and first interlayer dielectric 34, IC chip 26 integrates PCM RF switch 2 and active device 48 in a structure compatible with standard fabrication techniques. Where active device 48 is electrically connected to PCM contact 20 (shown in FIG. 1) of PCM RF switch 2, PCM RF switch 2 generally exhibits improved performance as a result of this integration, including lower ON state resistance ($R_{ON}$). Moreover, because PCM RF switch 2 is situated below first metallization level 32 and on substrate 28, PCM RF switch 2 can be situated in proximity to active device 48, and routing complexity is reduced.

Figure 2B:
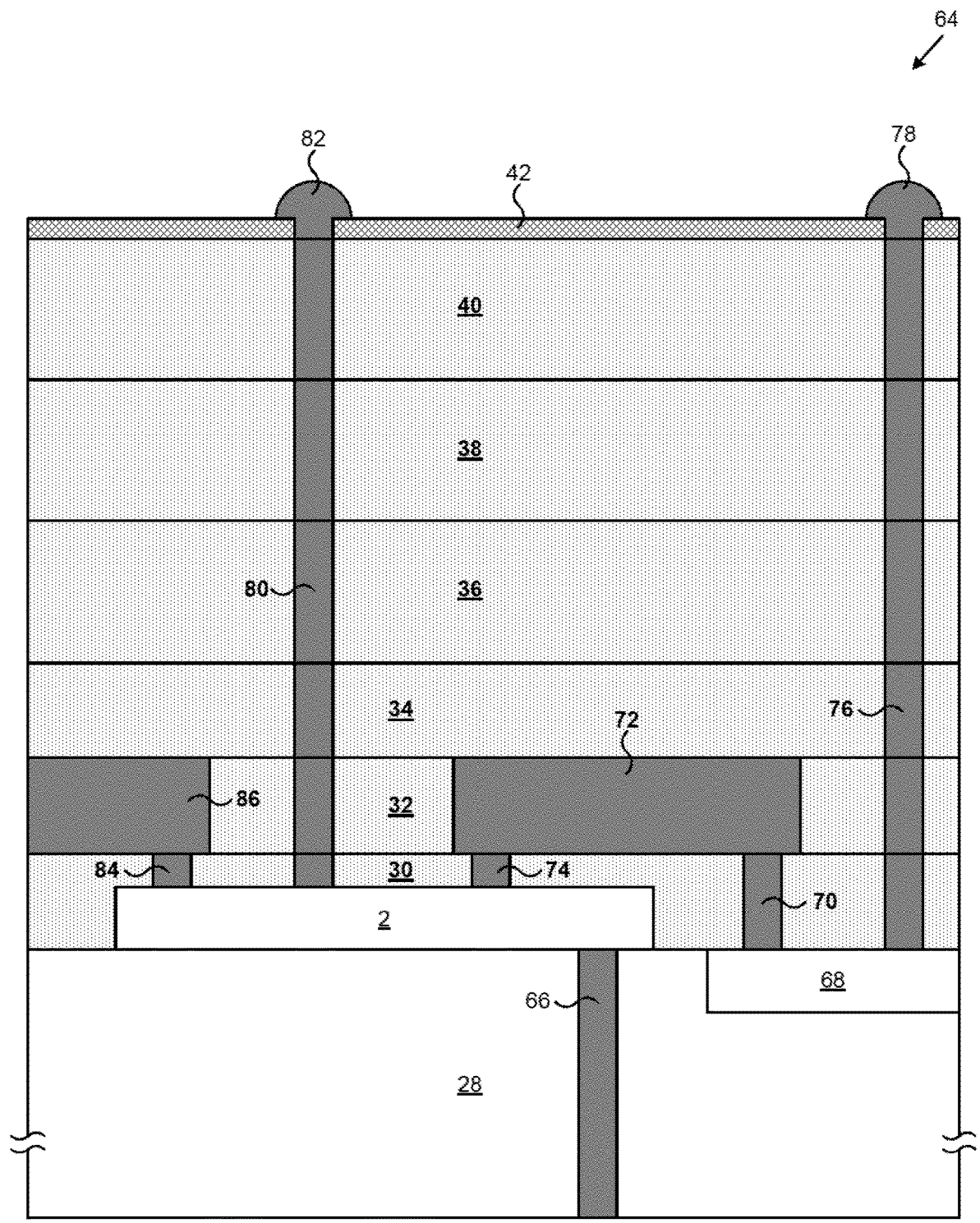
FIG. 2B illustrates a portion of an exemplary IC chip according to one implementation of the present application.

FIG. 2B illustrates a portion of an exemplary IC chip according to one implementation of the present application. IC chip 64 includes PCM RF switch 2, substrate 28, pre-metal dielectric 30, first metallization level 32, first interlayer dielectric 34, second metallization level 36, second interlayer dielectric 38, third metallization level 40, passivation 42, TSV 66, active device 68, vias 70, 74, 76, 80, and 84, interconnect metals 72 and 86, and micro bumps 78 and 82.

Pre-metal dielectric 30 is situated over substrate 28. First metallization level 32, first interlayer dielectric 34, second metallization level 36, second interlayer dielectric 38, third metallization level 40, and passivation 42 are sequentially situated over pre-metal dielectric 30. Substrate 28, pre-metal dielectric 30, first metallization level 32, first interlayer dielectric 34, second metallization level 36, second interlayer dielectric 38, third metallization level 40, and passivation 42 in FIG. 2B correspond to like structures in FIG. 2A, and may have any implementations and advantages described above.

Active device 68 is situated in substrate 28. PCM RF switch 2 is situated in pre-metal dielectric 30 and on substrate 28. TSV 66 is situated below PCM RF switch 2 and extends through substrate 28. TSV 66 electrically connects to PCM contact 20 (shown in FIG. 1) of PCM RF switch 2. Via 70 is situated in pre-metal dielectric 30 between active device 68 and interconnect metal 72. Interconnect metal 72 is situated in first metallization level 32. Via 74 is situated in pre-metal dielectric 30 between PCM RF switch 2 and interconnect metal 72. Via 70, interconnect metal 72, and via 74 electrically connect active device 68 to heater contact 24 (shown in FIG. 1) of PCM RF switch 2. Via 76 electrically connects active device 68 in substrate 28 to micro bump 78. Via 80 electrically connects heater contact 22 (shown in FIG. 1) of PCM RF switch 2 to micro bump 82. Micro bumps 78 and 82 are situated at the top of IC chip 64 and in windows in passivation 42. Via 84 is situated in pre-metal dielectric 30 between PCM RF switch 2 and interconnect metal 86. Interconnect metal 86 is situated in first metallization level 32. Via 84 electrically connects PCM contact 18 (shown in FIG. 1) of PCM RF switch 2 to interconnect metal 86. Interconnect metal 86 can electrically connect to other structures (not shown in FIG. 2B).

In IC chip 64, active device 68 is electrically connected to heater contact 24 (shown in FIG. 1) of PCM RF switch 2. In various implementations, active device 68 can be a transistor, an active circuit, an amplifier, a filter, a mixer, or a diode. For example, active device 68 can be a diode electrically connected to heater contact 24 (shown in FIG. 1) of PCM RF switch 2. In various implementations, active device 68 can be an active circuit comprising multiple active devices, or comprising passive devices in combination with at least one active device. For example, active device 68 can comprise part of a pulse generation circuit.

Active device 68 is electrically connected to micro bump 78. PCM RF switch 2 is electrically connected to micro bump 82. Micro bumps 78 and 82 provide external connections for IC chip 64. For example, micro bump 78 can provide an LNA (low noise amplifier) input terminal of active device 68, and micro bump 82 can provide a heating element terminal of PCM RF switch 2. Micro bumps 78 and 82 may have any implementations and advantages described above. In various implementations, PCM RF switch 2 and/or active device 68 may have more or fewer connections than shown in FIG. 2B.

In IC chip 64, substrate 28 is a heat spreader for PCM RF switch 2. Substrate 28 effectively dissipates heat generated by heating element 6 (shown in FIG. 1) of PCM RF switch 2, and PCM RF switch 2 can switch states with improved reliability. IC chip 64 integrates PCM RF switch 2 and active device 68 in a structure compatible with standard fabrication techniques. Where active device 68 is electrically connected to heater contact 24 (shown in FIG. 1) of PCM RF switch 2, PCM RF switch 2 generally exhibits improved performance as a result of this integration. Moreover, because PCM RF switch 2 is situated below first metallization level 32 and on substrate 28, PCM RF switch 2 can be situated in proximity to active device 68, and routing complexity is reduced.

Figure 3A:
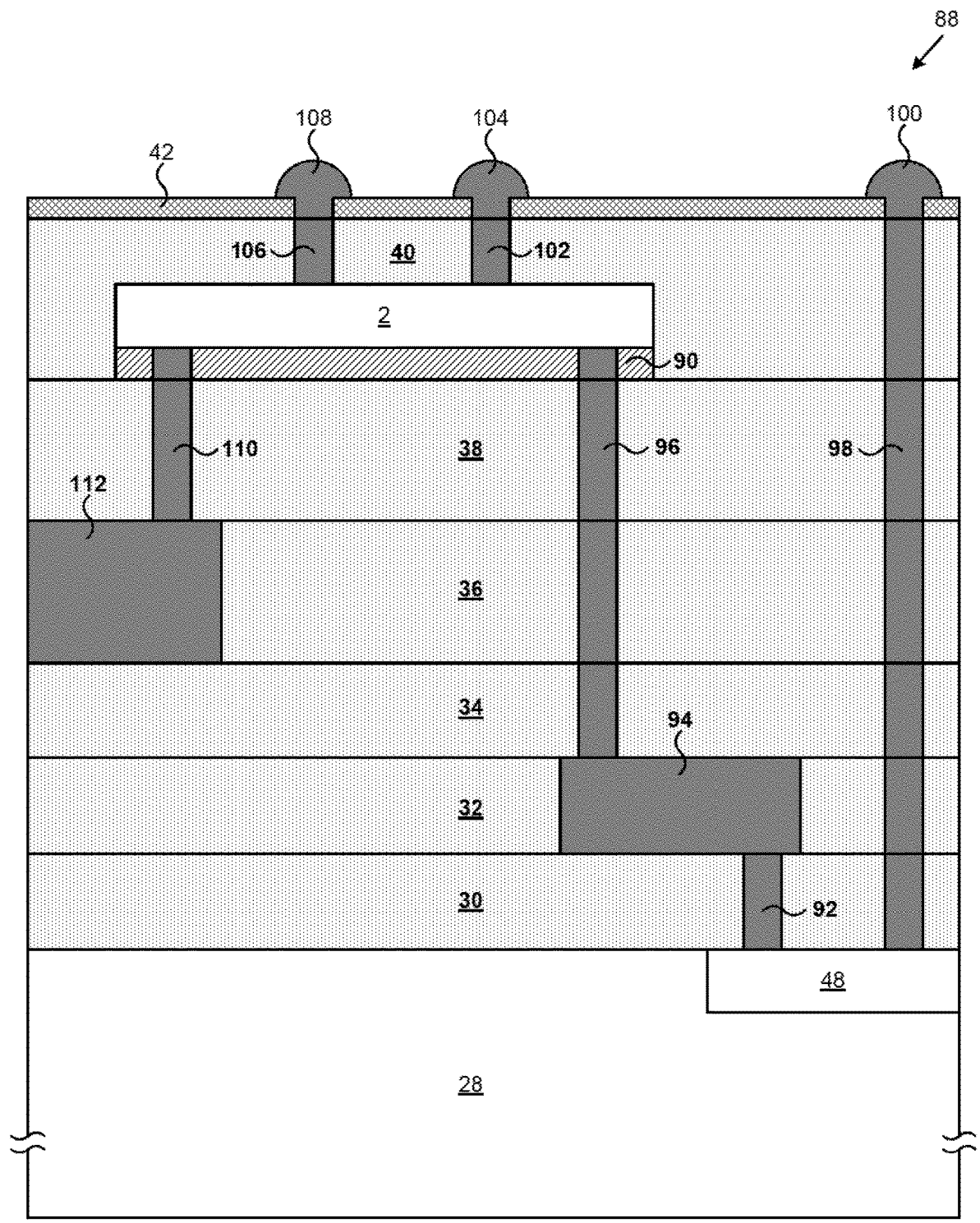
FIG. 3A illustrates a portion of an exemplary IC chip according to one implementation of the present application.

FIG. 3A illustrates a portion of an exemplary IC chip according to one implementation of the present application. IC chip 88 includes PCM RF switch 2, substrate 28, pre-metal dielectric 30, first metallization level 32, first interlayer dielectric 34, second metallization level 36, second interlayer dielectric 38, third metallization level 40, passivation 42, active device 48, dedicated heat spreader 90, vias 92, 96, 98, 102, 106, and 110, interconnect metals 94 and 112, and micro bumps 100, 104, and 108.

Pre-metal dielectric 30 is situated over substrate 28. First metallization level 32, first interlayer dielectric 34, second metallization level 36, second interlayer dielectric 38, third metallization level 40, and passivation 42 are sequentially situated over pre-metal dielectric 30. Substrate 28, pre-metal dielectric 30, first metallization level 32, first interlayer dielectric 34, second metallization level 36, second interlayer dielectric 38, third metallization level 40, and passivation 42 in FIG. 3A may have any implementations and advantages described above.

Active device 48 is situated in substrate 28. PCM RF switch 2 is situated in third metallization level 40, which is the top metallization level in the present implementation. Dedicated heat spreader 90 is also situated in third metallization level 40, under PCM RF switch 2. Via 92 is situated in pre-metal dielectric 30 between active device 48 and interconnect metal 92. Interconnect metal 94 is situated in first metallization level 32. Via 96 extends through first interlayer dielectric 34, second metallization level 36, second interlayer dielectric 38, and dedicated heat spreader 90, between interconnect metal 94 and PCM RF switch 2. Via 92, interconnect metal 94, and via 96 electrically connect active device 48 to PCM contact 20 (shown in FIG. 1) of PCM RF switch 2. Via 98 electrically connects active device 48 in substrate 28 to micro bump 100. Via 102 electrically connects heater contact 24 (shown in FIG. 1) of PCM RF switch 2 to micro bump 104. Via 106 electrically connects heater contact 22 (shown in FIG. 1) of PCM RF switch 2 to micro bump 108. Micro bumps 100, 104, and 108 are situated at the top of IC chip 88 and in windows in passivation 42. Via 110 extends through second interlayer dielectric 38 and dedicated heat spreader 90 between interconnect metal 112 and PCM RF switch 2. Interconnect metal 112 is situated in second metallization level 36. Via 110 electrically connects PCM contact 18 (shown in FIG. 1) of PCM RF switch 2 to interconnect metal 112. Interconnect metal 112 can electrically connect to other structures (not shown in FIG. 3).

Dedicated heat spreader 90 can comprise any material with high thermal conductivity and high electrical resistivity. In various implementations, dedicated heat spreader 90 can comprise aluminum nitride ($Al_XN_Y$), aluminum oxide ($Al_XO_Y$), beryllium oxide ($Be_XO_Y$), diamond, or diamond-like carbon. Although dedicated heat spreader 90 is aligned with PCM RF switch 2, it is noted that the actual relative dimensions of dedicated heat spreader 90 may be different from the exemplary cross-sectional view shown in FIG. 3A. For example, dedicated heat spreader 90 can be wider or narrower than PCM RF switch 2, or situated substantially between terminal segments 8 of heating element 6 (shown in FIG. 1), where heating element 6 is hottest.

In IC chip 88, active device 48 is electrically connected to PCM contact 20 (shown in FIG. 1) of PCM RF switch 2. In various implementations, active device 48 can be a transistor, an active circuit, an amplifier, a filter, a mixer, or a diode. For example, active device 48 can be an LNA (low noise amplifier) having its output electrically connected to PCM contact 20 (shown in FIG. 1) of PCM RF switch 2. In various implementations, active device 48 can be an active circuit comprising multiple active devices, or comprising passive devices in combination with at least one active device.

Active device 48 is electrically connected to micro bump 100. PCM RF switch 2 is electrically connected to micro bumps 104 and 108. Micro bumps 100, 104, and 108 provide external connections for IC chip 88. For example, micro bump 100 can provide an LNA (low noise amplifier) input terminal of active device 48, micro bump 104 can provide a first heating element terminal of PCM RF switch 2, and micro bump 108 can provide a second heating element terminal of PCM RF switch 2. Micro bumps 100, 104, and 108 may have any implementations and advantages described above. In various implementations, PCM RF switch 2 and/or active device 48 may have more or fewer connections than shown in FIG. 3A.

In IC chip 88, because PCM RF switch 2 is not situated on substrate 28, TSVs are not used to connect to PCM RF switch 2, and substrate 28 does not perform as a heat spreader for PCM RF switch 2. Rather, vias 96, 102, 106, and 110 provide electrical connections for PCM RF switch 2, and dedicated heat spreader 90 dissipates heat generated by heating element 6 (shown in FIG. 1) of PCM RF switch 2. PCM RF switch 2 can switch states with improved reliability. IC chip 88 also does not require allocation of a portion of the surface area of substrate 28 for heat spreading, which increases the total surface area available for other active devices.

In order for PCM RF switch 2 to maintain active segments 14 (shown in FIG. 1) and passive segments 16 (shown in FIG. 1) and operate properly, PCM RF switch 2 cannot be exposed to extremely high temperatures during processing of IC chip 88. In IC chip 88, because first metallization level 32 and second metallization level 36 are formed prior to PCM RF switch 2 in third metallization level 40, high-temperature processes and high-temperature compatible materials can be used in first metallization level 32 and second metallization level 36. IC chip 88 also integrates PCM RF switch 2 and active device 48 in a structure compatible with standard fabrication techniques. Where active device 48 is electrically connected to PCM contact 20 (shown in FIG. 1) of PCM RF switch 2, PCM RF switch 2 generally exhibits improved performance as a result of this integration.

Because PCM RF switch 2 is situated in third metallization level 40 (i.e., the top metallization level), PCM RF switch 2 can be situated in proximity to structures in second metallization level 36 in order to reduce routing complexity. Additionally, because PCM RF switch 2 is situated in third metallization level 40 (i.e., the top metallization level), PCM RF switch 2 exhibits reduced parasitic capacitive coupling with active device 48 and other devices in or near substrate 28.

Figure 3B:
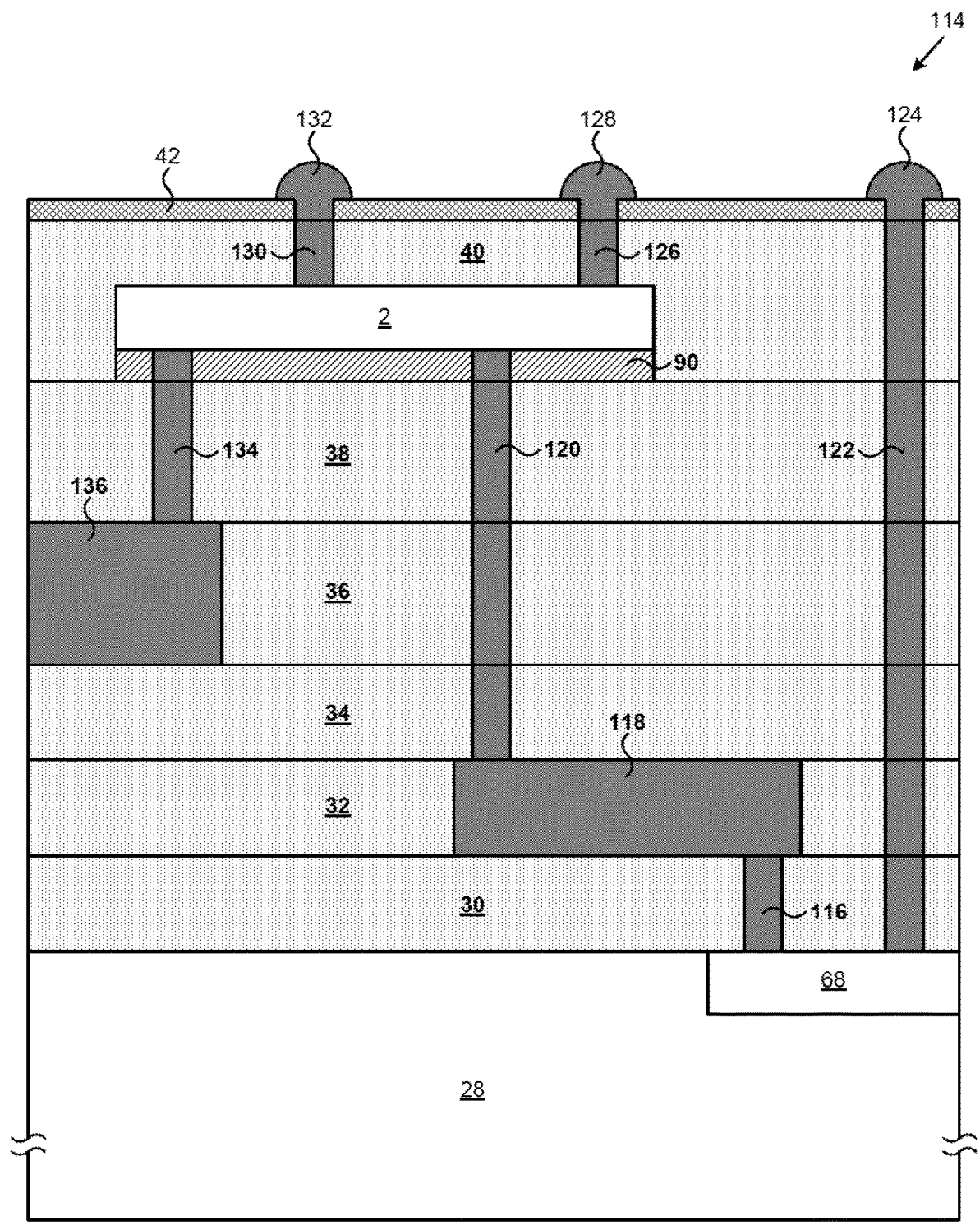
FIG. 3B illustrates a portion of an exemplary IC chip according to one implementation of the present application.

FIG. 3B illustrates a portion of an exemplary IC chip according to one implementation of the present application. IC chip 114 includes PCM RF switch 2, substrate 28, pre-metal dielectric 30, first metallization level 32, first interlayer dielectric 34, second metallization level 36, second interlayer dielectric 38, third metallization level 40, passivation 42, active device 68, dedicated heat spreader 90, vias 116, 120, 122, 126, 130, and 134, interconnect metals 118 and 136, and micro bumps 124, 128, and 132.

Pre-metal dielectric 30 is situated over substrate 28. First metallization level 32, first interlayer dielectric 34, second metallization level 36, second interlayer dielectric 38, third metallization level 40, and passivation 42 are sequentially situated over pre-metal dielectric 30. Substrate 28, pre-metal dielectric 30, first metallization level 32, first interlayer dielectric 34, second metallization level 36, second interlayer dielectric 38, third metallization level 40, and passivation 42 in FIG. 3B may have any implementations and advantages described above.

Active device 68 is situated in substrate 28. PCM RF switch 2 is situated in third metallization level 40, which is the top metallization level in the present implementation. Dedicated heat spreader 90 is also situated in third metallization level 40, under PCM RF switch 2. Via 116 is situated in pre-metal dielectric 30 between active device 68 and interconnect metal 118. Interconnect metal 118 is situated in first metallization level 32. Via 120 extends through first interlayer dielectric 34, second metallization level 36, second interlayer dielectric 38, and dedicated heat spreader 90, between interconnect metal 118 and PCM RF switch 2. Via 116, interconnect metal 118, and via 120 electrically connect active device 68 to heater contact 24 (shown in FIG. 1) of PCM RF switch 2. Via 122 electrically connects active device 68 in substrate 28 to micro bump 124. Via 126 electrically connects PCM contact 20 (shown in FIG. 1) of PCM RF switch 2 to micro bump 128. Via 130 electrically connects heater contact 22 (shown in FIG. 1) of PCM RF switch 2 to micro bump 132. Micro bumps 124, 128, and 132 are situated at the top of IC chip 114 and in windows in passivation 42. Via 134 extends through second interlayer dielectric 38 and dedicated heat spreader 90 between interconnect metal 136 and PCM RF switch 2. Interconnect metal 136 is situated in second metallization level 36. Via 134 electrically connects PCM contact 18 (shown in FIG. 1) of PCM RF switch 2 to interconnect metal 136. Interconnect metal 136 can electrically connect to other structures (not shown in FIG. 3B).

In IC chip 114, active device 68 is electrically connected to heater contact 24 (shown in FIG. 1) of PCM RF switch 2. In various implementations, active device 68 can be a transistor, an active circuit, an amplifier, a filter, a mixer, or a diode. For example, active device 68 can be a diode electrically connected to heater contact 24 (shown in FIG. 1) of PCM RF switch 2. In various implementations, active device 68 can be an active circuit comprising multiple active devices, or comprising passive devices in combination with at least one active device. For example, active device 68 can comprise part of a pulse generation circuit.

Active device 68 is electrically connected to micro bump 124. PCM RF switch 2 is electrically connected to micro bumps 128 and 132. Micro bumps 124, 128, and 132 provide external connections for IC chip 114. For example, micro bump 124 can provide an LNA (low noise amplifier) input terminal of active device 68, micro bump 128 can provide an RF input terminal of PCM RF switch 2, and micro bump 132 can provide a heating element terminal of PCM RF switch 2. Micro bumps 124, 128, and 132 may have any implementations and advantages described above. In various implementations, PCM RF switch 2 and/or active device 68 may have more or fewer connections than shown in FIG. 3B.

In IC chip 114, vias 120, 126, 130, and 134 provide electrical connections for PCM RF switch 2, and dedicated heat spreader 90 dissipates heat generated by heating element 6 (shown in FIG. 1) of PCM RF switch 2. PCM RF switch 2 can switch states with improved reliability. IC chip 114 also does not require allocation of a portion of the surface area of substrate 28 for heat spreading, which increases the total surface area available for other active devices.

In IC chip 114, because first metallization level 32 and second metallization level 36 are formed prior to PCM RF switch 2 in third metallization level 40, high-temperature processes and high-temperature compatible materials can be used in first metallization level 32 and second metallization level 36, without exposing PCM RF switch 2 to extremely high temperatures. IC chip 114 also integrates PCM RE switch 2 and active device 68 in a structure compatible with standard fabrication techniques. Where active device 68 is electrically connected to heater contact 24 (shown in FIG. 1) of PCM RF switch 2, PCM RF switch 2 generally exhibits improved performance as a result of this integration.

Because PCM RF switch 2 is situated in third metallization level 40 (i.e., the top metallization level), PCM RF switch 2 can be situated in proximity to structures in second metallization level 36 in order to reduce routing complexity. Additionally, because PCM RE switch 2 is situated in third metallization level 40 (i.e., the top metallization level), PCM RF switch 2 exhibits reduced parasitic capacitive coupling with active device 48 and other devices in or near substrate 28.

Figure 4A:
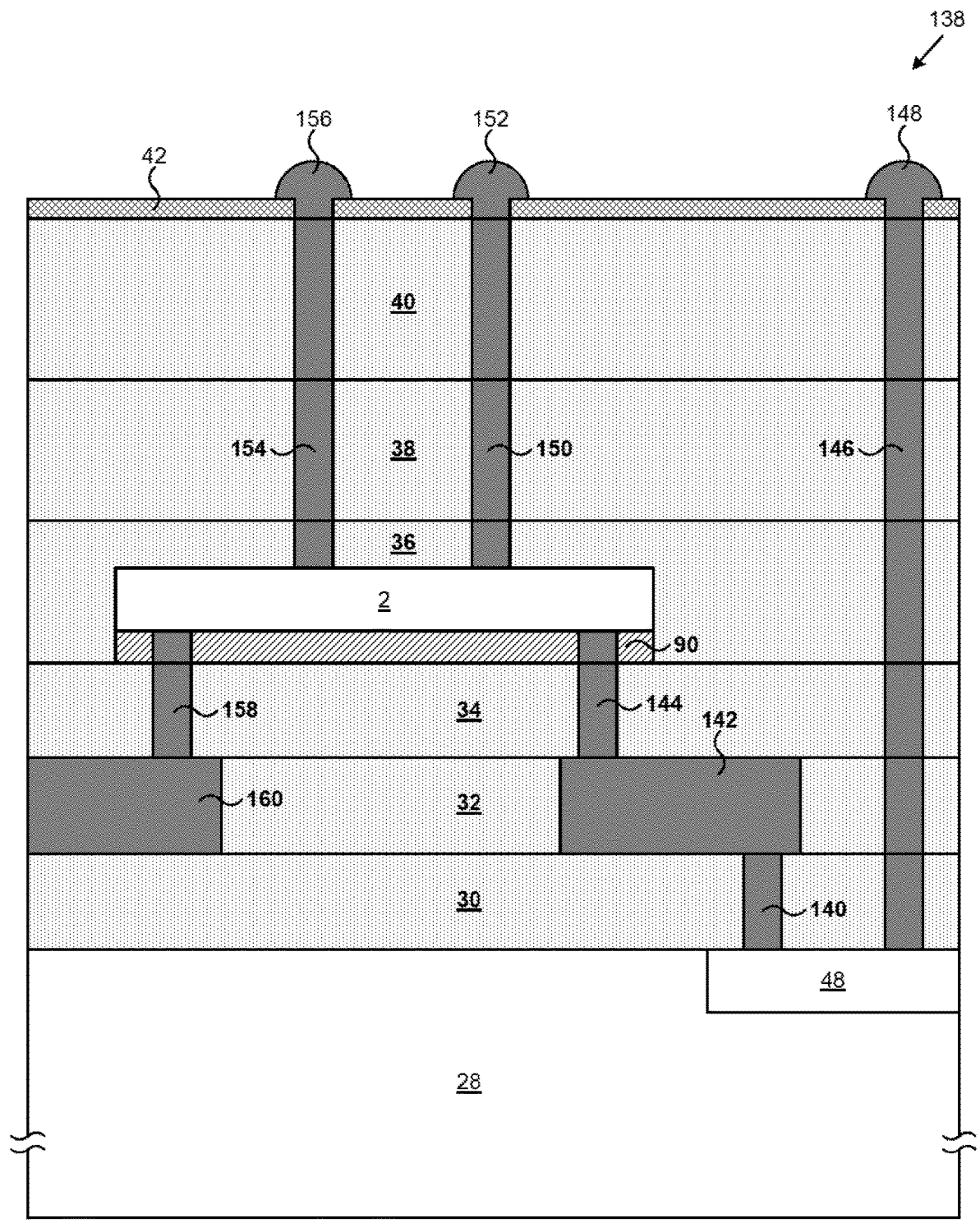
FIG. 4A illustrates a portion of an exemplary IC chip according to one implementation of the present application.

FIG. 4A illustrates a portion of an exemplary IC chip according to one implementation of the present application. IC chip 138 includes PCM RF switch 2, substrate 28, pre-metal dielectric 30, first metallization level 32, first interlayer dielectric 34, second metallization level 36, second interlayer dielectric 38, third metallization level 40, passivation 42, active device 48, dedicated heat spreader 90, vias 140, 144, 146, 150, 154, and 158, interconnect metals 142 and 160, and micro bumps 148, 152, and 156.

Pre-metal dielectric 30 is situated over substrate 28. First metallization level 32, first interlayer dielectric 34, second metallization level 36, second interlayer dielectric 38, third metallization level 40, and passivation 42 are sequentially situated over pre-metal dielectric 30. Substrate 28, pre-metal dielectric 30, first metallization level 32, first interlayer dielectric 34, second metallization level 36, second interlayer dielectric 38, third metallization level 40, and passivation 42 in FIG. 4A may have any implementations and advantages described above.

Active device 48 is situated in substrate 28. In the present example, PCM RF switch 2 is situated in second metallization level 36. Dedicated heat spreader 90 is also situated in second metallization level 36, under PCM RF switch 2. Via 140 is situated in pre-metal dielectric 30 between active device 48 and interconnect metal 142. Interconnect metal 142 is situated in first metallization level 32. Via 144 extends through first interlayer dielectric 34 and dedicated heat spreader 90, between interconnect metal 142 and PCM RF switch 2. Via 140, interconnect metal 142, and via 144 electrically connect active device 48 to PCM contact 20 (shown in FIG. 1) of PCM RF switch 2. Via 146 electrically connects active device 48 in substrate 28 to micro bump 148. Via 150 electrically connects heater contact 24 (shown in FIG. 1) of PCM RF switch 2 to micro bump 152. Via 154 electrically connects heater contact 22 (shown in FIG. 1) of PCM RF switch 2 to micro bump 156. Micro bumps 148, 152, and 156 are situated at the top of IC chip 138 and in windows in passivation 42. Via 158 extends through first interlayer dielectric 34 and dedicated heat spreader 90 between interconnect metal 160 and PCM RF switch 2. Interconnect metal 160 is situated in first metallization level 32. Via 158 electrically connects PCM contact 18 (shown in FIG. 1) of PCM RF switch 2 to interconnect metal 160. Interconnect metal 160 can electrically connect to other structures (not shown in FIG. 4).

In IC chip 138, active device 48 is electrically connected to PCM contact 20 (shown in FIG. 1) of PCM RF switch 2. In various implementations, active device 48 can be a transistor, an active circuit, an amplifier, a filter, a mixer, or a diode. For example, active device 48 can be an LNA (low noise amplifier) having its output electrically connected to PCM contact 20 (shown in FIG. 1) of PCM RF switch 2. In various implementations, active device 48 can be an active circuit comprising multiple active devices, or comprising passive devices in combination with at least one active device.

Active device 48 is electrically connected to micro bump 148. PCM RF switch 2 is electrically connected to micro bumps 152 and 156. Micro bumps 148, 152, and 156 provide external connections for IC chip 138. For example, micro bump 148 can provide an LNA (low noise amplifier) input terminal of active device 48, micro bump 152 can provide a first heating element to of PCM RF switch 2, and micro bump 156 can provide a second heating element terminal of PCM RF switch 2. Micro bumps 148, 152, and 156 may have any implementations and advantages described above. In various implementations, PCM RF switch 2 and/or active device 48 may have more or fewer connections than shown in FIG. 4A.

In IC chip 138, vias 144, 150, 154, and 158 provide electrical connections for PCM RF switch 2, and dedicated heat spreader 90 dissipates heat generated by heating element 6 (shown in FIG. 1) of PCM RF switch 2. PCM RF switch 2 can switch states with improved reliability. IC chip 138 also does not require allocation of a portion of the surface area of substrate 28 for heat spreading, which increases the total surface area available for other active devices.

In IC chip 138, because first metallization level 32 is formed prior to PCM RF switch 2 in second in level 36, high-temperature processes and high-temperature compatible materials can be used in first metallization level 32, without exposing PCM RF switch 2 to extremely high temperatures. IC chip 138 also integrates PCM RF switch 2 and active device 48 in a structure compatible with standard fabrication techniques. Where active device 48 is electrically connected to PCM contact 20 (shown in FIG. 1) of PCM RF switch 2, PCM RF switch 2 generally exhibits improved performance as a result of this integration.

Because PCM RF switch 2 is situated in second metallization level 36, PCM RF switch 2 can balance proximity to active device 48 and proximity to structures in second metallization level 36 and/or third metallization level 40 in order to reduce routing complexity. Additionally, because PCM RF switch 2 is situated in second metallization level 36, PCM RF switch 2 exhibits reduced parasitic capacitive coupling with active device 48 and other devices in or near substrate 28.

Figure 4B:
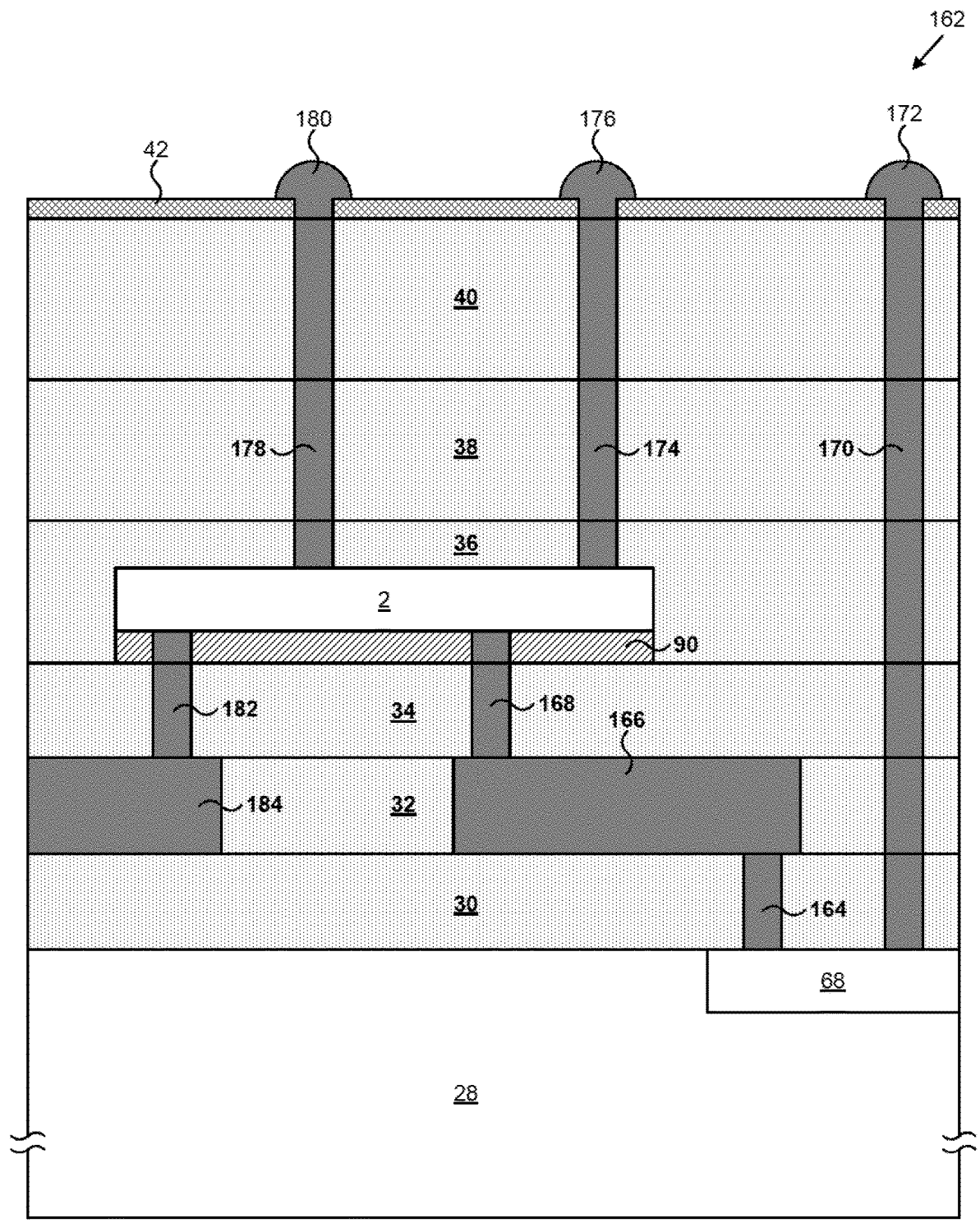
FIG. 4B illustrates a portion of an exemplary IC chip according to one implementation of the present application.

FIG. 4B illustrates a portion of an exemplary IC chip according to one implementation of the present application. IC chip 162 includes PCM RF switch 2, substrate 28, pre-metal dielectric 30, first metallization level 32, first interlayer dielectric 34, second metallization level 36, second interlayer dielectric 38, third metallization level 40, passivation 42, active device 68, dedicated heat spreader 90, vias 164, 168, 170, 174, 178, and 182, interconnect metals 166 and 184, and micro bumps 172, 76, and 180.

Pre-metal dielectric 30 is situated over substrate 28. First metallization level 32, first interlayer dielectric 34, second metallization level 36, second interlayer dielectric 38, third metallization level 40, and passivation 42 are sequentially situated over pre-metal dielectric 30. Substrate 28, pre-metal dielectric 30, first metallization level 32, first interlayer dielectric 34, second metallization level 36, second interlayer dielectric 38, third metallization level 40, and passivation 42 in FIG. 4B may have any implementations and advantages described above.

Active device 68 is situated in substrate 28. PCM RF switch 2 is situated in second metallization level 36. Dedicated heat spreader 90 is also situated in second metallization level 36, under PCM RF switch 2. Via 164 is situated in pre-metal dielectric 30 between active device 68 and interconnect metal 166. Interconnect metal 166 is situated in first metallization level 32. Via 168 extends through first interlayer dielectric 34 and dedicated heat spreader 90, between interconnect metal 166 and PCM RF switch 2. Via 164, interconnect metal 166, and via 168 electrically connect active device 68 to heater contact 24 (shown in FIG. 1) of PCM RF switch 2. Via 170 electrically connects active device 68 in substrate 28 to micro bump 172. Via 174 electrically connects PCM contact 20 (shown in FIG. 1) of PCM RF switch 2 to micro bump 176. Via 178 electrically connects heater contact 22 (shown in FIG. 1) of PCM RF switch 2 to micro bump 180. Micro bumps 172, 176, and 180 are situated at the top of IC chip 162 and in windows in passivation 42. Via 182 extends through first interlayer dielectric 34 and dedicated heat spreader 90 between interconnect metal 184 and PCM RF switch 2. Interconnect metal 184 is situated in first metallization level 32. Via 182 electrically connects PCM contact 18 (shown in FIG. 1) of PCM RF switch 2 to interconnect metal 184. Interconnect metal 184 can electrically connect to other structures (not shown in FIG. 4B).

In IC chip 162, active device 68 is electrically connected to heater contact 24 (shown in FIG. 1) of PCM RF switch 2. In various implementations, active device 68 can be a transistor, an active circuit, an amplifier, a filter, a mixer, or a diode. For example, active device 68 can be a diode electrically connected to heater contact 24 (shown in FIG. 1) of PCM RF switch 2. In various implementations, active device 68 can be an active circuit comprising multiple active devices, or comprising passive devices in combination with at least one active device. For example, active device 68 can comprise part of a pulse generation circuit.

Active device 68 is electrically connected to micro bump 172. PCM RF switch 2 is electrically connected to micro bumps 176 and 180. Micro bumps 172, 176, and ISO provide external connections for IC chip 162. For example, micro bump 172 can provide an LNA (low noise amplifier) input terminal of active device 68, micro bump 176 can provide an RF input terminal of PCM RF switch 2, and micro bump 180 can provide a heating element terminal of PCM RF switch 2. Micro bumps 172, 176, and 180 may have any implementations and advantages described above.

In various implementations, PCM RF switch 2 and/or active device 68 may have more or fewer connections than shown in FIG. 4B.

In IC chip 162, vias 168, 174, 178, and 182 provide electrical connections for PCM RF switch 2, and dedicated heat spreader 90 dissipates heat generated by heating element 6 (shown in FIG. 1) of PCM RF switch 2. PCM RF switch 2 can switch states with improved reliability. IC chip 162 also does not require allocation of a portion of the surface area of substrate 28 for heat spreading, which increases the total surface area available for other active devices.

In IC chip 162, because first metallization level 32 is formed prior to PCM RF switch 2 in second metallization level 36, high-temperature processes and high-temperature compatible materials can be used in first metallization level 32, without exposing PCM RF switch 2 to extremely high temperatures. IC chip 162 also integrates PCM RF switch 2 and active device 68 in a structure compatible with standard fabrication techniques. Where active device 68 is electrically connected to heater contact 24 (shown in FIG. 1) of PCM RF switch 2, PCM RF switch 2 generally exhibits improved performance as a result of this integration.

Because PCM RF switch 2 is situated in second metallization level 36, PCM RF switch 2 can balance proximity to active device 68 and proximity to structures in second metallization level 36 and/or third metallization level 40 in order to reduce routing complexity. Additionally, because PCM RF switch 2 is situated in second metallization level 36, PCM RF switch 2 exhibits reduced parasitic capacitive coupling with active device 48 and other devices in or near substrate 28.

Figure 5A:
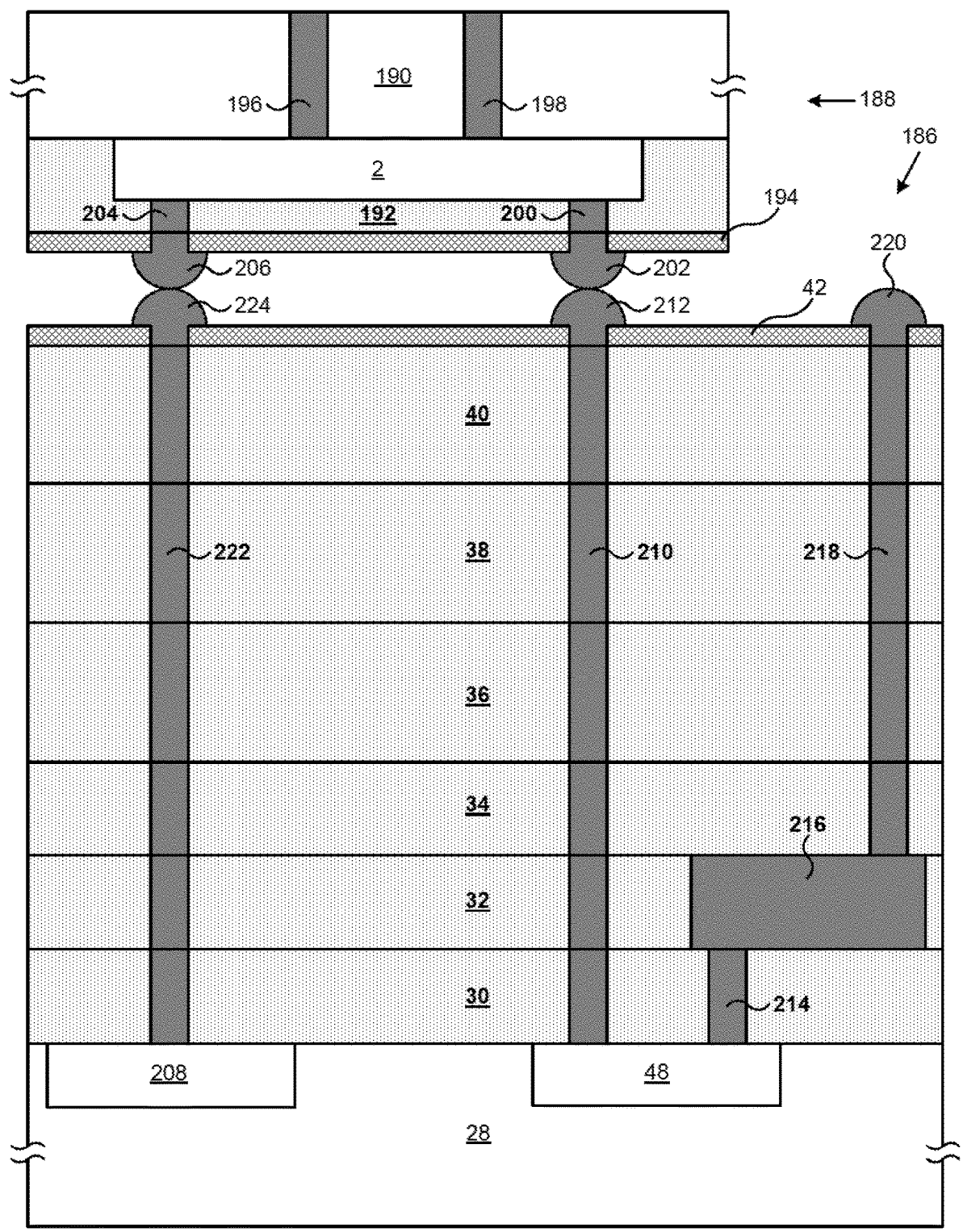
FIG. 5A illustrates a portion of an exemplary composite device, including an IC chip and a flip chip, according to one implementation of the present application.

FIG. 5A illustrates a portion of an exemplary composite device, including an IC chip and a flip chip, according to one implementation of the present application. The composite device of FIG. 5A includes IC chip 186 and flip chip 188. Flip chip 188 includes PCM RF switch 2, substrate 190, pre-metal dielectric 192, passivation 194, TSVs 196 and 198, vias 200 and 204, and micro bumps 202 and 206. IC chip 186 includes substrate 28, pre-metal dielectric 30, first metallization level 32, first interlayer dielectric 34, second metallization level 36, second interlayer dielectric 38, third metallization level 40, passivation 42, active devices 48 and 208, vias 210, 214, 218, and 222, interconnect metal 216, and micro bumps 220, 212, and 224.

In IC chip 186, pre-metal dielectric 30 is situated over substrate 28. First metallization level 32, first interlayer dielectric 34, second metallization level 36, second interlayer dielectric 38, third metallization level 40, and passivation 42 are sequentially situated over pre-metal dielectric 30. Substrate 28, pre-metal dielectric 30, first metallization level 32, first interlayer dielectric 34, second metallization level 36, second interlayer dielectric 38, third metallization level 40, and passivation 42 in FIG. 5A may have any implementations and advantages described above.

In IC chip 186, active devices 48 and 208 are situated in substrate 28. Via 210 electrically connects active device 48 in substrate 28 to micro bump 212. Via 214 is situated in pre-metal dielectric 30 between active device 48 and interconnect metal 216. Interconnect metal 216 is situated in first metallization level 32. Via 218 is situated between interconnect metal 216 and micro bump 220. Via 214, interconnect metal 216, and via 218 electrically connect active device 48 in substrate 28 to micro bump 220. Via 222 electrically connects active device 208 in substrate 28 to micro bump 224. Micro bumps 220, 212, and 224 are situated at the top of IC chip 186 and in windows in passivation 42.

In flip chip 188, PCM RF switch 2 is situated in pre-metal dielectric 192 and under substrate 190. TSVs 196 and 198 are situated above PCM RF switch 2 and extend through substrate 190. TSV 196 electrically connects to heater contact 22 (shown in FIG. 1) of PCM RF switch 2. TSV 198 electrically connects to heater contact 24 (shown in FIG. 1) of PCM RF switch 2. Via 200 is situated in pre-metal dielectric 192 between PCM RF switch 2 and micro bump 202. Via 204 is situated in pre-metal dielectric 192 between PCM RF switch 2 and micro bump 206. Via 200 electrically connects PCM contact 20 (shown in FIG. 1) of PCM RF switch 2 to micro bump 202. Via 204 electrically connects PCM contact 18 (shown in FIG. 1) of PCM RF switch 2 to micro bump 206. Micro bumps 202 and 206 are situated at the bottom of flip chip 188 and in windows in passivation 194.

Substrate 190 in flip chip 188 can comprise a material with high thermal conductivity. In various implementations, substrate 190 is a Si, Ge, $Si_xGe_y$, $Si_xC_y$, or group substrate. Substrate 190 can also comprise a material with high thermal conductivity and high electrical resistivity. In various implementations, substrate 190 can comprise $Al_xN_y$, $Al_xO_y$, $Be_xO_y$, diamond, or diamond-like carbon. In flip chip 188, TSVs 196 and 198, pre-metal dielectric 192, passivation 194, vias 200 and 204, and micro bumps 202 and 206 may have any implementations and advantages described above.

To arrive at the composite device in FIG. 5A, PCM RF switch 2 is formed above substrate 190, and then flip chip 188 is flipped and situated over IC chip 186, using any method known in the art. Micro bumps 202 and 206 of flip chip 188 are connected to micro bumps 212 and 224 of IC chip 186, respectively. Thus, active device 48 in IC chip 186 is electrically connected to PCM contact 20 (shown in FIG. 1) of PCM RF switch 2 in flip chip 188, and active device 208 in IC chip 186 is electrically connected to PCM contact 18 (shown in FIG. 1) of PCM RF switch 2 in flip chip 188. In various implementations, active devices 48 and/or 208 can be a transistor, an active circuit, an amplifier, a filter, a mixer, or a diode. For example, active device 48 in IC chip 186 can be an LNA (low noise amplifier) having its output electrically connected to PCM contact 20 (shown in FIG. 1) of PCM RF switch 2 in flip chip 188, and active device 208 in IC chip 186 can be a mixer having its input electrically connected to PCM contact 18 (shown in FIG. 1) of PCM RF switch 2 in flip chip 188. In various implementations, active devices 48 and/or 208 can be an active circuit comprising multiple active devices, or comprising passive devices in combination with at least one active device.

Active device 48 is also electrically connected to micro bump 220. Micro bump 220 provides external connection for IC chip 186. For example, micro bump 220 can provide an LNA (low noise amplifier) input terminal of active device 48. Micro bumps 202, 206, 220, 212, and 224 in FIG. 5A may have any implementations and advantages described above. In various implementations, PCM RF switch 2, active device 48 and/or active device 208 may have more or fewer connections than shown in FIG. 5A.

In the composite device of FIG. 5A, substrate 190 in flip chip 188 dissipates heat generated by heating element 6 (shown in FIG. 1) of PCM RF switch 2. PCM RF switch 2 can switch states with improved reliability. IC chip 186 also does not require allocation of a portion of the surface area of substrate 28 for heat spreading, which increases the total surface area available for other active devices.

Because the composite device of FIG. 5A utilizes IC chip 186 and flip chip 188, specialized structures and processes can be employed in each chip. For example, substrate 190 in flip chip 188 can be an electrically insulating substrate, such as an $Al_xN_y$ substrate or diamond-like carbon substrate, while substrate 28 in IC chip 186 can be an electrically conductive or semiconductive substrate, such as Si. As another example, high-temperature processes and high-temperature compatible materials can be used in IC chip 186 without exposing PCM RF switch 2 in flip chip 188 to extremely high temperatures.

The composite device of FIG. 5A also integrates PCM RF switch 2 and active devices 48 and 208, where active device 48 is electrically connected to PCM contact 20 (shown in FIG. 1) of PCM RF switch 2, and where active device 208 is electrically connected to PCM contact 18 (shown in FIG. 1) of PCM RF switch 2, in a structure compatible with standard fabrication techniques. Additionally, because PCM RF switch 2 is situated in flip chip 188, PCM RF switch 2 exhibits reduced parasitic capacitive coupling with active devices 48 and 208 in IC chip 186.

Figure 5B:
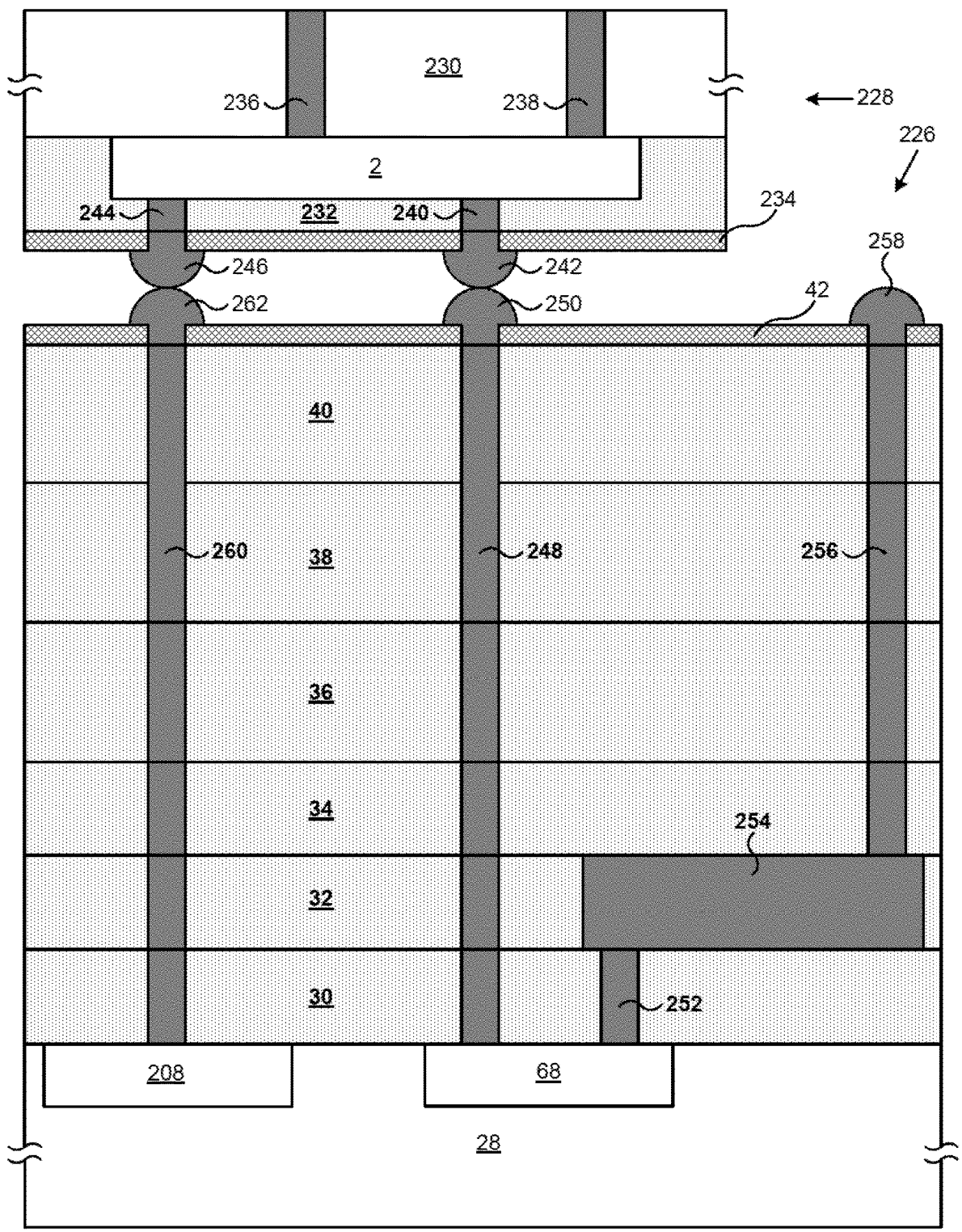
FIG. 5B illustrates a portion of an exemplary composite device, including an IC chip and a flip chip, according to one implementation of the present application.

FIG. 5B illustrates a portion of an exemplary composite device, including an IC chip and a flip clip, according to one implementation of the present application. The composite device of FIG. 5B includes IC chip 226 and flip chip 228. Flip chip 228 includes PCM RF switch 2, substrate 230, pre-metal dielectric 232, passivation 234, TSVs 236 and 238, vias 240 and 244, and micro bumps 242 and 246. IC chip 226 includes substrate 28, pre-metal dielectric 30, first metallization level 32, first interlayer dielectric 34, second metallization level 36, second interlayer dielectric 38, third metallization level 40, passivation 42, active devices 68 and 208, vias 248, 256, and 260, interconnect metal 254, and micro bumps 250, 258, and 262.

In IC chip 226, pre-metal dielectric 30 is situated over substrate 28. First metallization level 32, first interlayer dielectric 34, second metallization level 36, second interlayer dielectric 38, third metallization level 40, and passivation 42 are sequentially situated over pre-metal dielectric 30. Substrate 28, pre-metal dielectric 30, first metallization level 32, first interlayer dielectric 34, second metallization level 36, second interlayer dielectric 38, third metallization level 40, and passivation 42 in FIG. 5B may have any implementations and advantages described above.

In IC chip 226, active devices 68 and 208 are situated in substrate 28. Via 248 electrically connects active device 68 in substrate 28 to micro bump 250. Via 252 is situated in pre-metal dielectric 30 between active device 68 and interconnect metal 254. Interconnect metal 254 is situated in first metallization level 32. Via 256 is situated between interconnect metal 254 and micro bump 258. Via 252, interconnect metal 254, and via 256 electrically connect active device 68 in substrate 28 to micro bump 258. Via 260 electrically connects active device 208 in substrate 28 to micro bump 262. Micro bumps 250, 258, and 262 are situated at the top of IC chip 226 and in windows in passivation 42.

In flip chip 228, PCM RF switch 2 is situated in pre-metal dielectric 232 and under substrate 230. TSVs 236 and 238 are situated above PCM RF switch 2 and extend through substrate 230. TSV 236 electrically connects to heater contact 22 (shown in FIG. 1) of PCM RF switch 2. TSV 238 electrically connects to PCM contact 20 (shown in FIG. 1) of PCM RF switch 2. Via 240 is situated in pre-metal dielectric 232 between PCM RF switch 2 micro bump 242. Via 244 is situated in pre-metal dielectric 232 between PCM RF switch 2 micro bump 246. Via 240 electrically connects heater contact 24 (shown in FIG. 1) of PCM RF switch 2 to micro bump 242. Via 244 electrically connects PCM contact 18 (shown in FIG. 1) of PCM RF switch 2 to micro bump

246. Micro bumps 242 and 246 are situated at the bottom of flip chip 228 and in windows in passivation 234.

Substrate 230 in flip chip 228 can comprise a material with high thermal conductivity. In various implementations, substrate 230 is a Si, Ge, $Si_XGe_Y$, $Si_XC_Y$, or group substrate. Substrate 230 can also comprise a material with high thermal conductivity and high electrical resistivity. In various implementations, substrate 230 can comprise $Al_XN_Y$, $Al_XO_Y$, $Be_XO_Y$, diamond, or diamond-like carbon. In flip chip 228, TSVs 236 and 238, pre-metal dielectric 232, passivation 234, vias 240 and 244, and micro bumps 242 and 246 may have any implementations and advantages described above.

To arrive at the composite device in FIG. 5B PCM RF switch 2 is formed above substrate 230, and then flip chip 228 is flipped and situated over IC chip 226, using any method known in the art. Micro bumps 242 and 246 of flip chip 228 are connected to micro bumps 250 and 262 of IC chip 226, respectively. Thus, active device 68 in IC chip 226 is electrically connected to heater contact 24 (shown in FIG. 1) of PCM RF switch 2 in flip chip 228, and active device 208 in IC chip 226 is electrically connected to PCM contact 18 (shown in FIG. 1) of PCM RF switch 2 in flip chip 228. In various implementations, active devices 68 and/or 208 can be a transistor, an active circuit, an amplifier, a filter, a mixer, or a diode. For example, active device 68 in IC chip 226 can be a diode electrically connected to heater contact 24 (shown in FIG. 1) of PCM RF switch 2 in flip chip 228, and active device 208 in IC chip 226 call be a miter having its input electrically connected to PCM contact 18 (shown in FIG. 1) of PCM RF switch 2 in flip chip 228. In various implementations, active devices 68 and/or 208 can be an active circuit comprising multiple active devices, or comprising passive devices in combination with at least one active device. For example, active device 68 can comprise part of a pulse generation circuit.

Active device 68 is also electrically connected to micro bump 258. Micro bump 258 provides external connection for IC chip 226. For example, micro bump 258 can provide an LNA (low noise amplifier) input terminal of active device 68. Micro bumps 242, 246, 250, 258 and 262 in FIG. 5B may have any implementations and advantages described above. In various implementations, PCM RF switch 2, active device 68, and/or active device 208 may have more or fewer connections than shown in FIG. 5B.

In the composite device of FIG. 5B, substrate 230 in flip chip 228 dissipates heat generated by heating element 6 (shown in FIG. 1) of PCM RF switch 2. PCM RF switch 2 can switch states with improved reliability. IC chip 226 also does not require allocation of a portion of the surface area of substrate 28 for heat spreading, which increases the total surface area available for other active devices.

Because the composite device of FIG. 5B utilizes IC chip 226 and flip chip 228, specialized structures and processes can be employed in each chip. For example, substrate 230 in flip chip 228 can be an electrically insulating substrate, such as an $Al_XN_Y$ substrate or diamond-like carbon substrate, while substrate 28 in IC chip 226 can be an electrically conductive or semiconductive substrate, such as Si. As another example, high-temperature processes and high-temperature compatible materials can be used in IC chip 226 without exposing PCM RF switch 2 in flip chip 228 to extremely high temperatures.

The composite device of FIG. 5B also integrates PCM RF switch 2 and active devices 68 and 208, where active device 68 is electrically connected to heater contact 24 (shown in FIG. 1) of PCM RF switch 2, and where active device 208 is electrically connected to PCM contact 18 (shown in FIG. 1) of PCM RF switch 2, in a structure compatible with standard fabrication techniques. Additionally, because PCM RF switch 2 is situated in flip chip 228, PCM RF switch 2 exhibits reduced parasitic capacitive coupling with active devices 68 and 208 in IC chip 226.

Thus, various implementations of the present application achieve semiconductor devices having active devices and which utilize the inventive PCM RF switch of the present application to overcome the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. An IC chip including a substrate, said IC chip further comprising:
   a phase-change material (PCM) radio frequency (RF) switch integrated in said IC chip, said PCM RF switch comprising:
   a heating element;
   a PCM situated over said heating element;
   PCM contacts situated over passive segments of said PCM;
   said heating element extending transverse to said PCM and underlying an active segment of said PCM;
   an active device in said substrate;
   said PCM RF switch being situated below a first metallization level and on said substrate, wherein said substrate is a heat spreader for said PCM RF switch.

2. The IC chip of claim 1, wherein said active device is electrically connected to one of said PCM contacts of said PCM RF switch.

3. The IC chip of claim 1, wherein said active device is electrically connected to a heater contact of said PCM RF switch.

4. The IC chip of claim 1, wherein a heater contact or one of said PCM contacts of said PCM RF switch is electrically connected to a through-substrate-via (TSV) in said IC chip.

5. The IC chip of claim 1, wherein a heater contact or one of said PCM contacts of said PCM RF switch is electrically connected to a micro bump of said IC chip.

6. The IC chip of claim 1, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

7. An IC chip including a substrate, said IC chip further comprising:
   a phase-change material (PCM) radio frequency (RF) switch integrated in said IC chip, said PCM RF switch comprising:
   a heating element;
   a PCM situated over said heating element;
   PCM contacts situated over passive segments of said PCM;
   said heating element extending transverse to said PCM and underlying an active segment of said PCM;

an active device in said substrate;
said PCM RF switch being situated in or above a first metallization level, wherein
a dedicated heat spreader is situated under said PCM RF switch.

8. The IC chip of claim 7, wherein said active device is electrically connected to one of said PCM contacts of said PCM RF switch.

9. The IC chip of claim 7, wherein said active device is electrically connected to one of said PCM contacts of said PCM RF switch.

10. The IC chip of claim 7, wherein said active device is electrically connected to a heater contact of said PCM RF switch.

11. The IC chip of claim 7, wherein said PCM RF switch is situated in or above a top metallization level.

12. The IC chip of claim 7, wherein said dedicated heat spreader comprises material selected from the group consisting of aluminum nitride ($Al_XN_Y$), aluminum oxide ($Al_XO_Y$), beryllium oxide ($Be_XO_Y$), diamond, and diamond-like carbon.

13. The IC chip of claim 7, wherein a heater contact or one of said PCM contacts of said PCM RF switch is electrically connected to a micro bump of said IC chip.

14. A composite device comprising
a PCM RF switch in a flip chip, said PCM RF switch comprising a heating element, a PCM situated over said heating element, PCM contacts situated over passive segments of said PCM, said heating element extending transverse to said PCM and underlying an active segment of said PCM;
an IC chip comprising an active device;
said flip chip being situated over said IC chip, wherein one of said PCM contacts is electrically connected to said IC chip.

15. The composite device of claim 14, wherein said active device in said IC chip is electrically connected to one of said PCM contacts of said PCM RF switch in said flip chip.

16. The composite device of claim 14, wherein said active device in said IC chip is electrically connected to a heater contact of said PCM RF switch in said flip chip.

17. The composite device of claim 14, wherein a heater contact or one of said PCM contacts of said PCM RF switch is electrically connected to a through-substrate-via (TSV) in said flip chip.

18. The composite device of claim 14, wherein a heater contact or one of said PCM contacts of said PCM RF switch is electrically connected to a micro bump of said flip chip.

19. The IC chip of claim 1, wherein said active device is selected from the group consisting of a transistor, an active circuit, and an amplifier.

20. The IC chip of claim 1, wherein said active device is selected from the group consisting of a filter and a mixer.

21. The IC chip of claim 1, wherein said active device is a diode.

* * * * *